United States Patent
Bao et al.

(10) Patent No.: US 11,289,365 B2
(45) Date of Patent: Mar. 29, 2022

(54) AIR GAP UNDERNEATH PASSIVE DEVICES

(71) Applicant: QUALCOMM Incorporated, San Diego, CA (US)

(72) Inventors: Junjing Bao, San Diego, CA (US); Ye Lu, San Diego, CA (US); Haitao Cheng, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/676,663

(22) Filed: Nov. 7, 2019

(65) Prior Publication Data

US 2021/0143050 A1 May 13, 2021

(51) Int. Cl.
| | | |
|---|---|---|
| *H01L 21/64* | (2006.01) | |
| *H01L 29/06* | (2006.01) | |
| *H01L 49/02* | (2006.01) | |
| *H01L 21/764* | (2006.01) | |

(52) U.S. Cl.
CPC ............ *H01L 21/764* (2013.01); *H01L 28/10* (2013.01); *H01L 28/40* (2013.01); *H01L 29/0649* (2013.01)

(58) Field of Classification Search
CPC ..... H01L 28/40; H01L 28/10; H01L 27/0805; H01L 21/764; H01L 21/7682; H01L 29/515; H01L 29/0649
See application file for complete search history.

(56) References Cited

U.S. PATENT DOCUMENTS

| | | | | |
|---|---|---|---|---|
| 6,287,931 | B1* | 9/2001 | Chen | H01L 21/76224 257/E21.022 |
| 6,387,747 | B1* | 5/2002 | Cha | H01L 23/5227 257/E21.022 |
| 10,707,120 | B1* | 7/2020 | Yami | H01L 21/76801 |
| 2005/0093668 | A1* | 5/2005 | Bueyuektas | H01L 27/08 336/200 |
| 2005/0225420 | A1* | 10/2005 | Chen | H01F 17/02 336/200 |
| 2007/0026574 | A1* | 2/2007 | Beatson | H01L 24/05 438/123 |
| 2009/0322446 | A1* | 12/2009 | Daley | H01L 23/5222 333/185 |

\* cited by examiner

*Primary Examiner* — John A Bodnar
(74) *Attorney, Agent, or Firm* — Patterson & Sheridan, L.L.P.

(57) ABSTRACT

Certain aspects of the present disclosure generally relate to a semiconductor device including an air gap underneath passive devices. The semiconductor device generally includes a substrate layer, a passive device layer, and a dielectric layer disposed between the substrate layer and the passive device layer, wherein the dielectric layer includes an air gap disposed beneath at least one passive device in the passive device layer.

16 Claims, 6 Drawing Sheets

FIG. 1

(Prior Art)

AIR GAP UNDERNEATH PASSIVE DEVICES

TECHNICAL FIELD

Certain aspects of the present disclosure generally relate to electronic components and, more particularly, to techniques for improving performance of a semiconductor device using an air gap underneath passive devices.

BACKGROUND

Advances in technology have resulted in smaller and more powerful computing devices. The prevalence of these computing devices is driven in part by the many functions that are now enabled on such devices. Demand for such functions increases processing capability requirements and, in some cases, generates a need for more powerful batteries. Within the limited space of the housing of these computing devices, batteries compete with the processing circuitry. These and other factors contribute to a continued miniaturization of components within the circuitry.

Miniaturization of the components impacts all aspects of the processing circuitry including the transistors and passive elements in the processing circuitry, such as capacitors and inductors. One miniaturization technique involves moving some passive elements from the printed circuit board into the integrated circuitry. One technique for moving reactive elements into the integrated circuitry involves creating metal-oxide-metal (MOM) capacitors and inductors during back-end-of-line (BEOL) integrated circuit (IC) fabrication.

SUMMARY

Certain aspects of the present disclosure are generally directed to a semiconductor device. The semiconductor device generally includes a substrate layer, a passive device layer, and a dielectric layer disposed between the substrate layer and the passive device layer, wherein the dielectric layer includes an air gap disposed beneath at least one passive device in the passive device layer.

Certain aspects of the present disclosure generally relate to a method for fabricating a semiconductor device. The method generally includes forming a dielectric layer above a substrate layer; forming an air gap in the dielectric layer; and forming a passive device layer above the dielectric layer such that the air gap is disposed beneath at least one passive device in the passive device layer.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIGS. 3A-K illustrate example operations for fabricating a semiconductor device including an air gap underneath passive devices, in accordance with certain aspects of the present disclosure.

DETAILED DESCRIPTION

Certain aspects of the present disclosure are generally directed to a semiconductor device, such as an integrated circuit, including an air gap underneath passive devices in the semiconductor device. An example semiconductor device implemented with this air gap generally includes a substrate layer, a passive device layer, and a dielectric layer disposed between the substrate layer and the passive device layer, wherein the dielectric layer includes an air gap disposed beneath at least one passive device in the passive device layer.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Certain terminology may also be used in the following description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Example Semiconductor Device

As noted above, as the demand for more powerful computing devices increases, so does the demand for miniaturization of components within these devices. For example, one miniaturization technique involves moving certain reactive elements, such as inductors and capacitors (e.g., metal-oxide-metal (MOM) capacitors), from a printed circuit board (PCB) into integrated circuitry. However, moving such reactive elements into the integrated circuitry may introduce performance-related issues with these reactive elements. For example, when a MOM capacitor is formed in the integrated circuitry, the physical structure of the MOM capacitor may introduce parasitic shunt capacitance ($C_p$) between the metal fingers and a substrate (e.g., a silicon substrate) of the integrated circuitry. Further, when the MOM capacitor is used in a resonant circuit with an inductor (e.g., in radio frequency (RF) front-ends for impedance matching or antenna tuning), the tuning range associated with this resonant circuit may be dependent on $C_p$. For example, the larger the parasitic shunt capacitance is, the lower the tuning range of the resonant circuit is.

Similarly, when an inductor is formed in the integrated circuitry, a quality factor (Q) associated with the inductor may be negatively impacted by parasitic shunt capacitance between the inductor and the substrate of the integrated circuit. For example, as the parasitic shunt capacitance increases, the Q of the inductor decreases, which also decreases a self-resonant frequency of the inductor and tuning range of the resonant circuit described above. Thus, due to these negative impacts, passive device designers usually place the MOM capacitor and inductor on a dielectric area of the integrated circuit with minimum dummy metal density to reduce the parasitic shunt capacitance and/or increase the Q, as illustrated in FIG. 1.

Figure 1:
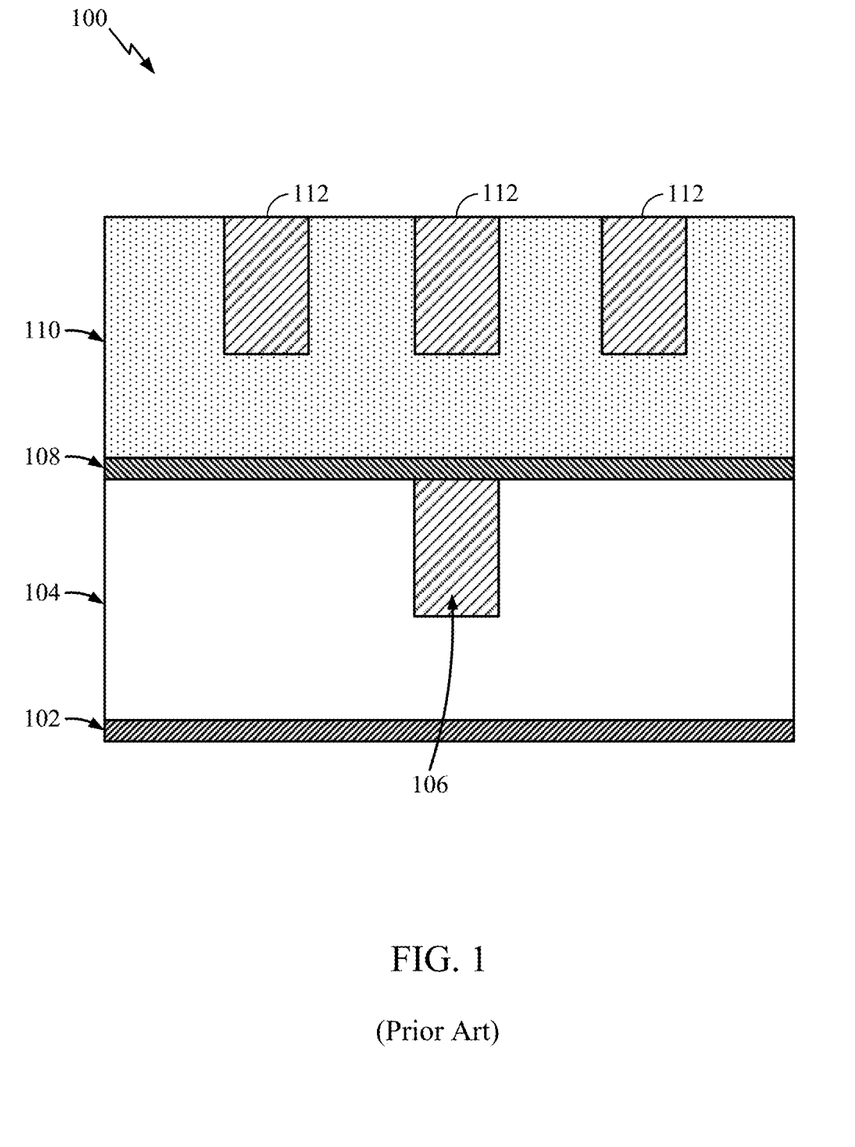
FIG. 1 illustrates a cross-section of a conventional semiconductor device including passive devices.

FIG. 1 is a cross-section of a conventional semiconductor device 100 including passive devices. As illustrated, the semiconductor device 100 may include a substrate layer 102, a dielectric layer 104, a dummy metal structure 106, an etch stop layer 108, and a passive device layer 110. The substrate layer 102 may be composed of any suitable substrate material, such as silicon, glass, ceramic, etc. The passive device layer 110 may be composed of a low dielectric constant (κ) material, such as carbon-doped silicon oxide (SiCOH), and may include a plurality of passive device components 112 embedded in the low-κ material. In some cases, the plurality of passive device components 112 may include electrical components corresponding to a capacitor (e.g., a MOM capacitor) and/or an inductor and may be composed of a metal (e.g., copper (Cu)).

As noted above, the passive device components 112 may have parasitic shunt capacitance between the metal components and the substrate layer 102, which may affect a tuning range of a capacitor and/or the Q and self-resonant frequency of an inductor. Thus, to help alleviate these issues and reduce the parasitic shunt capacitance, semiconductor device designs usually place the passive device components 112 (e.g., the MOM capacitor and/or inductor) in a low-κ material and minimize a density of the dummy metal structure 106. However, even after taking such measures, the parasitic shunt capacitance remains a significant issue for passive devices in integrated circuits for some applications. Thus, aspects of the present disclosure provide techniques for further reducing the negative effects of parasitic shunt capacitance to passive devices in a semiconductor device, such as an integrated circuit. For example, in some cases, techniques for reducing the parasitic shunt capacitance may involve forming an air gap in a dielectric material layer underneath the passive devices.

Figure 2A:
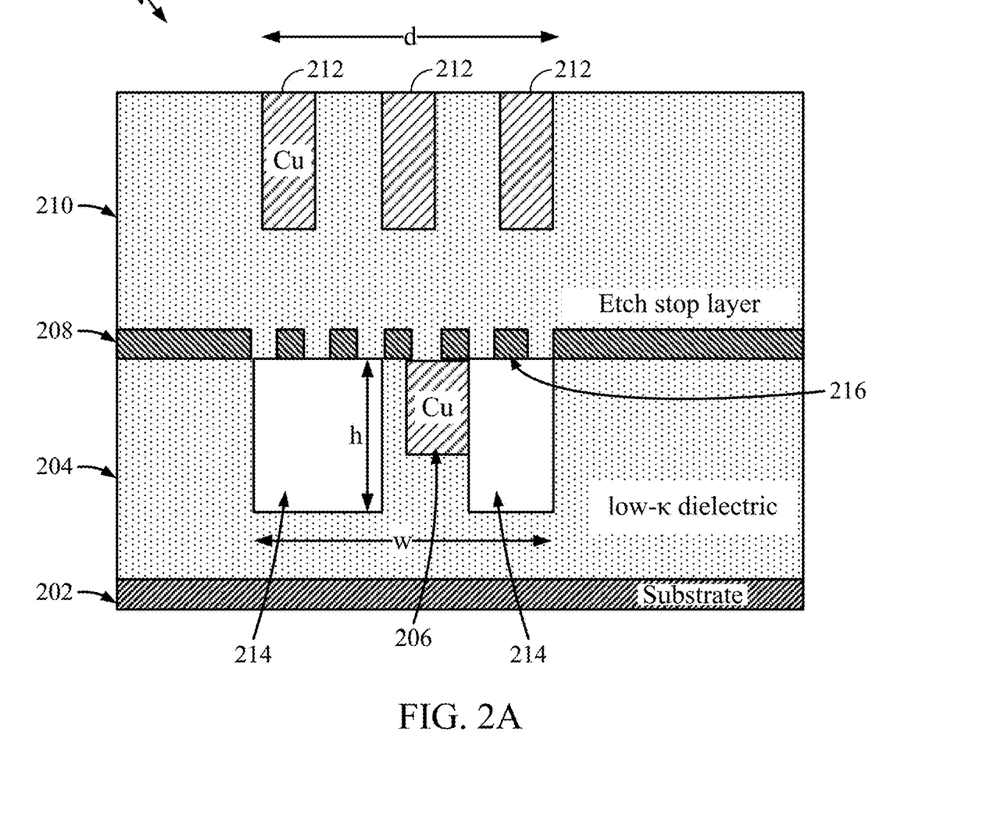
FIGS. 2A and 2B illustrate example frontal and transverse cross-sections of a semiconductor device including an air gap underneath passive devices, according to certain aspects presented herein.
Figure 2B:
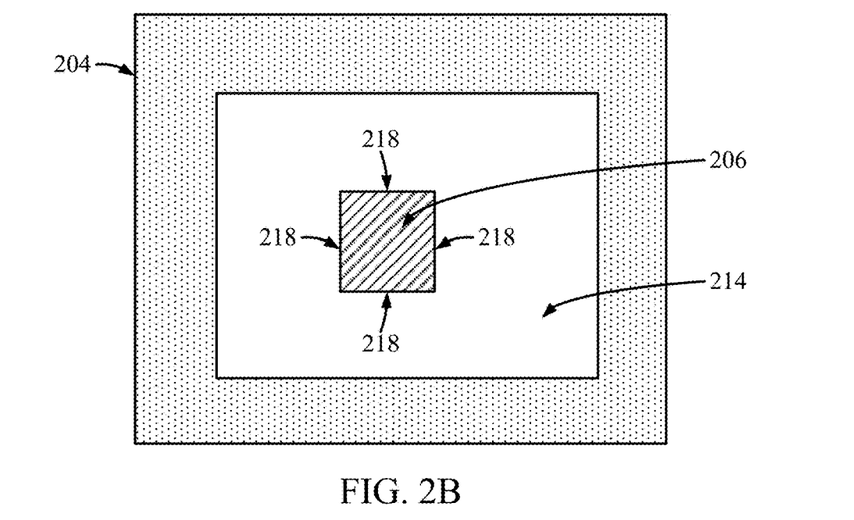

FIG. 2A illustrates an example frontal cross-section of a semiconductor device 200 including an air gap underneath passive devices, according to certain aspects presented herein. FIG. 2B illustrates a transverse cross-sectional view of the semiconductor device 200 illustrated in FIG. 2A, looking down from the bottom of an etch stop layer. As illustrated, the semiconductor device 200 (e.g., an integrated circuit) may include a substrate layer 202, a dielectric layer 204, an etch stop layer 208, and a passive device layer 210. According to aspects, the substrate layer 202 may be composed of any suitable substrate material, such as silicon, ceramic, glass, etc. The dielectric layer 204 may be composed of any suitable low dielectric constant (low-k) material, such as a carbon-doped oxide dielectric material (e.g., SiCOH). The etch stop layer 208 may be composed of any suitable material (e.g., silicon carbon nitride (SiCN)) to stop or arrest an etch process and protect the dielectric layer 204 from being etched. Additionally, the semiconductor device 200 may include a dummy metal structure 206, as shown. The dummy metal structure 206 may be disposed as a pillar (also referred to as a column) in the dielectric layer 204 and may be composed of a metal, such as copper (Cu), cobalt (Co), tungsten (W), ruthenium (Ru), or a combination thereof.

The passive device layer 210 may also be composed of a low-κ material (e.g., SiCOH) and may include one or more passive device components 212. In some cases, the passive device components 212 may correspond to electrical elements of a capacitor (e.g., electrode fingers of a MOM capacitor) and/or an inductor (e.g., coils of an inductor) and may be composed of a metal, such as copper (Cu), cobalt (Co), tungsten (W), ruthenium (Ru), or a combination thereof. As noted above, in traditional semiconductor devices with passive devices (e.g., as illustrated in FIG. 1), these passive devices may experience parasitic shunt capacitance between the passive device components 212 and the substrate layer, which may affect the tuning range, Q, and/or the resonant frequency associated with these passive devices. Thus, to reduce the parasitic capacitance experienced by these passive devices, aspects of the present disclosure provide techniques whereby an air gap is formed underneath these passive devices, reducing the dielectric constant of the material below these passive devices, thus resulting in lowered parasitic shunt capacitance.

Figure 3A:
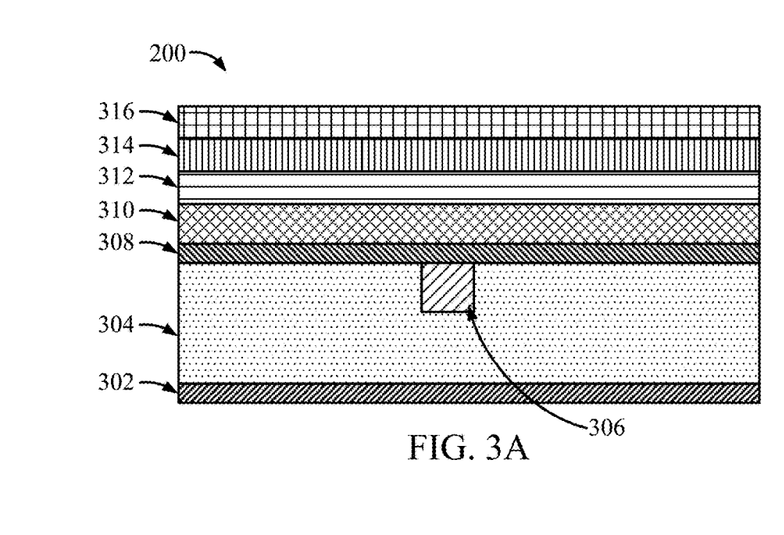

For example, as illustrated in FIGS. 2A and 2B, the semiconductor device 200 may include an air gap 214 disposed in the dielectric layer 204. As explained in greater detail below with reference to FIGS. 3A-3K, the air gap 214 may be formed in the dielectric layer 204 using a nanostructure-gap pattern 216 transferred into the etch stop layer 208. According to aspects, the nanostructure-gap pattern 216 allows for portions of the dielectric layer 204 to be selectively removed (e.g., etched) to form the air gap 214. As illustrated in FIG. 2A, the air gap 214 may have the same width, w, as the extent, d, of the passive device components 212 (e.g., the boundaries of the air gap line up vertically with the outermost edges of the passive device components under which the air gap is disposed). For other aspects, the air gap 214 may have a greater or a smaller width than the extent of the passive device components 212.

According to aspects, the dielectric layer 204 may comprise a plurality of sublayers, and the air gap 214 may extend through a subset of the plurality of sublayers of the dielectric layer 204. Additionally, as illustrated, the dielectric layer 204 includes a dummy metal structure 206 disposed as a pillar with lateral surfaces 218 surrounded by the air gap 214, as illustrated in FIG. 2B. In some cases, as illustrated in FIG. 2A, the air gap 214 has a greater height, h, than the dummy metal structure 206. In other cases, the air gap 214 has a same height as the dummy metal structure 206. In other cases, the air gap 214 has a smaller height than the dummy metal structure 206.

Additionally, while only one air gap is shown in FIGS. 2A and 2B, it should be understood that the semiconductor device 200 may include more than one air gap. In this case, each of these multiple air gaps may be disposed underneath none, one, or multiple passive devices.

FIGS. 3A-K illustrate example operations for fabricating a semiconductor device, such as the semiconductor device 200, including an air gap underneath passive devices, in accordance with certain aspects of the present disclosure.

As illustrated in FIG. 3A, fabrication of the semiconductor device 200 may begin with a substrate layer 302.

According to aspects, the substrate layer 302 may be composed of any suitable substrate material, such as silicon, ceramic, glass, etc. A dielectric layer 304 may then be formed on top of the substrate layer 302. The dielectric layer 304 may be composed of any suitable low dielectric constant (low-k) material, such as a carbon-doped oxide dielectric material (e.g., SiCOH). In some cases, the dielectric layer 304 may comprise a plurality of sublayers (not illustrated). Additionally, as illustrated, a dummy metal structure 306 may then be formed in the dielectric layer 304 (e.g., using photolithography and metal deposition). The dummy metal structure 306 may be disposed as a pillar in the dielectric layer 304 and may be composed of a metal, such as copper (Cu), cobalt (Co), tungsten (W), ruthenium (Ru), or a combination thereof.

According to aspects, an etch stop layer 308 may then be formed/disposed on top of the dielectric layer 304, as illustrated. The etch stop layer 308 may be composed of any suitable material (e.g., SiCN) to stop or arrest an etch process and protect the dielectric layer 304 from being etched. Thereafter, a near-frictionless carbon (NFC) layer 310 may then be deposited on top of the etch stop layer 308. Next, a low temperature oxide (LTO) layer 312 may be deposited on top of the near-frictionless carbon layer 310. A silicon anti-reflective coating (SiARC) layer 314 may then be deposited on top of the low temperature oxide layer 312. Finally, a diblock copolymer layer 316 may be deposited on top of the silicon anti-reflective coating layer 314. As will be explained in greater detail below, the near-frictionless carbon layer 310, the low temperature oxide layer 312, the silicon anti-reflective coating layer 314, and the diblock copolymer layer 316 may be used to transfer a nanostructure-gap pattern (formed by the diblock copolymer layer 316) in the etch stop layer 308.

The diblock copolymer layer 316 is composed of a diblock copolymer. A copolymer comprises at least two different kinds of polymers (e.g., materials A and B), which are mixed when applied, but separate after annealing. The annealed copolymer has good etch selectivity, where one type of polymer (e.g., material A) remains after etching, but another type of polymer (e.g., material B) is removed during etching. A diblock copolymer is a macromolecule in which two or more chemically distinct repeating units are joined together in covalent bond. For example, a polystyrene-block-polymethylmethacylate (PS-b-PMMA) block copolymer (BCP) consists of a polystyrene (PS) chain covalently bonded to a polymethyl methacrylate (PMMA) chain. If the blocks are immiscible, the BCP can self-assemble into periodic nanostructures with dimensions ranging from a few nm to several 100 nm.

Figure 3B:
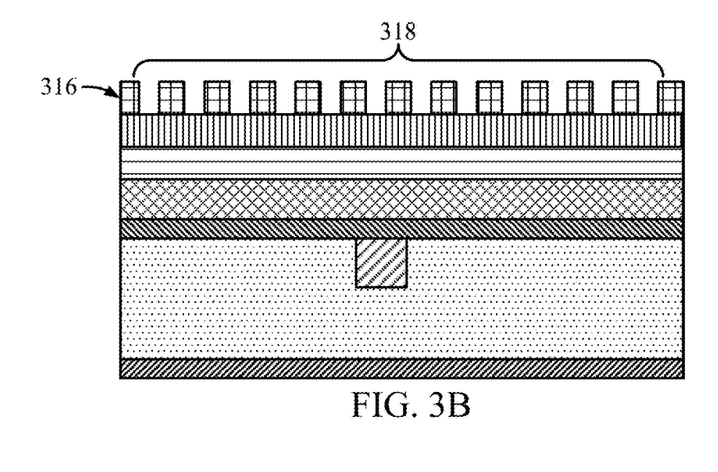

Accordingly, when the diblock copolymer layer 316 is deposited on the silicon anti-reflective coating layer 314, the diblock copolymer layer 316 will self-assemble into periodic nanostructure comprising two or more chemically distinct repeating units, such as repeating PS chains covalently bonded to PMMA chains. According to aspects, as illustrated in FIG. 3B, one of the two or more chemically distinct repeating units may be removed (e.g., by etching) from the diblock copolymer layer 316, leaving a repeating nanostructure-gap pattern 318 in the diblock copolymer layer 316. For example, the PS may be removed, leaving behind the PMMA in a periodic pattern. According to aspects, as described in greater detail below, the nanostructure-gap pattern 318 may be used to form an air gap in the dielectric layer 304 to reduce parasitic shunt capacitance experienced by passive devices in semiconductor device 200.

Figure 3C:
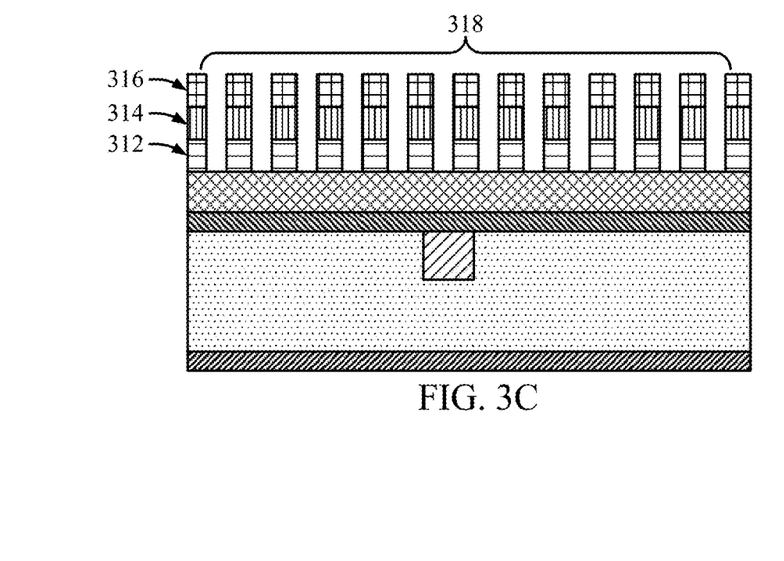

According to aspects, as illustrated in FIG. 3C, the nanostructure-gap pattern 318 may then be transferred (e.g., via etching) from the diblock copolymer layer 316 into the silicon anti-reflective coating layer 314 and the low temperature oxide layer 312.

Figure 3D:
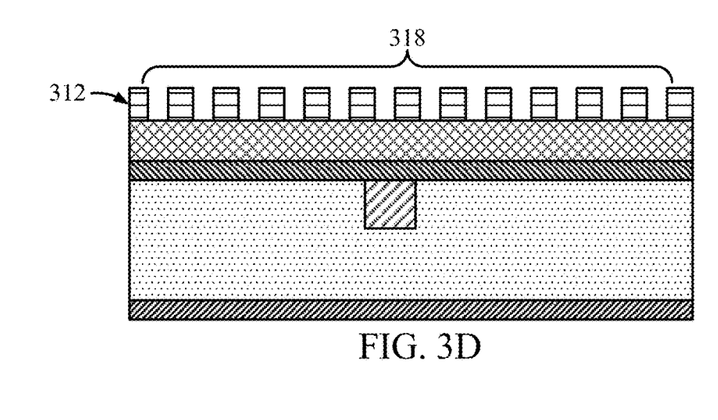

As illustrated in FIG. 3D, resist stripping may be used to remove the diblock copolymer layer 316 and the silicon anti-reflective coating layer 314 from the low temperature oxide layer 312. Additionally, as illustrated, the low temperature oxide layer 312 may now include the nanostructure-gap pattern 318 due to the operations performed in FIG. 3C.

Figure 3E:
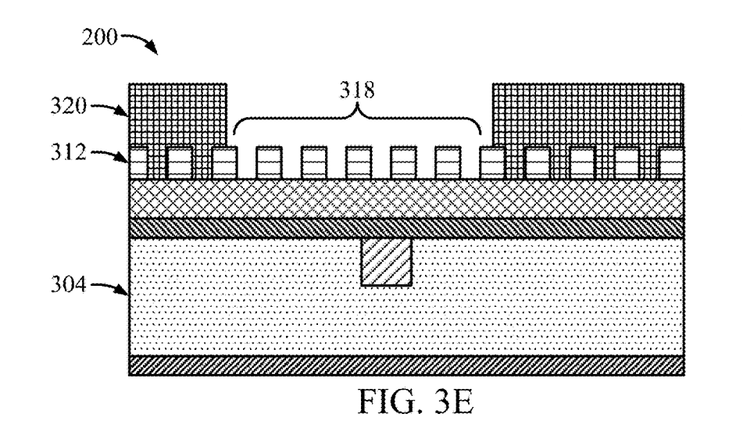

Thereafter, as illustrated in FIG. 3E, a block-out resist layer 320 may be deposited on top of the low temperature oxide layer 312 to block out non-passive device areas of the semiconductor device 200. According to aspects, applying the block-out resist layer 320 may allow the air gap to be placed only in regions of the dielectric layer 304 that sit underneath passive devices in the semiconductor device 200 (e.g., by only allowing the nanostructure-gap pattern 318 to be transferred into layers designed to be underneath the passive devices that will be subsequently added).

Figure 3F:
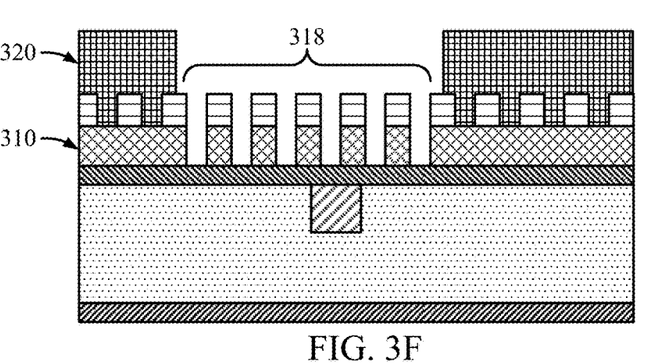

As illustrated in FIG. 3F, the nanostructure-gap pattern 318 may then be transferred into regions of the near-frictionless carbon layer 310 not protected by the block-out resist layer 320. This transfer may be accomplished via etching the unprotected regions of the near-frictionless carbon layer 310 according to the nanostructure-gap pattern 318 in the low temperature oxide layer 312.

Figure 3G:
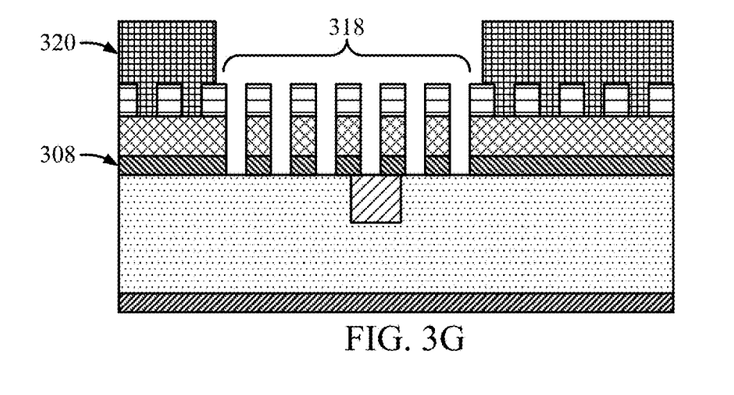

As illustrated in FIG. 3G, the nanostructure-gap pattern 318 may then be transferred into regions of the etch stop layer 308 not protected by the block-out resist layer 320. This further transfer in FIG. 3G may be accomplished via additional etching of the unprotected regions of the etch stop layer 308 according to the nanostructure-gap pattern 318 in the low temperature oxide layer 312 and the near-frictionless carbon layer 310. This additional etching in FIG. 3G may be different (e.g., may use a different chemical) from the etching performed in FIGS. 3E and 3F.

Figure 3H:
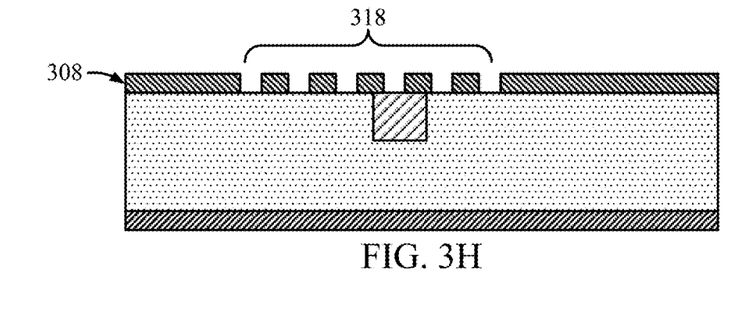

As illustrated in FIG. 3H, the block-out resist layer 320, the low temperature oxide layer 312, and the near-frictionless carbon layer 310 may be removed (e.g., by resist stripping) from the etch stop layer 308. Additionally, as illustrated, the etch stop layer 308 may now include the nanostructure-gap pattern 318 due to the operations performed in FIG. 3G.

Figures 3I, 3K:
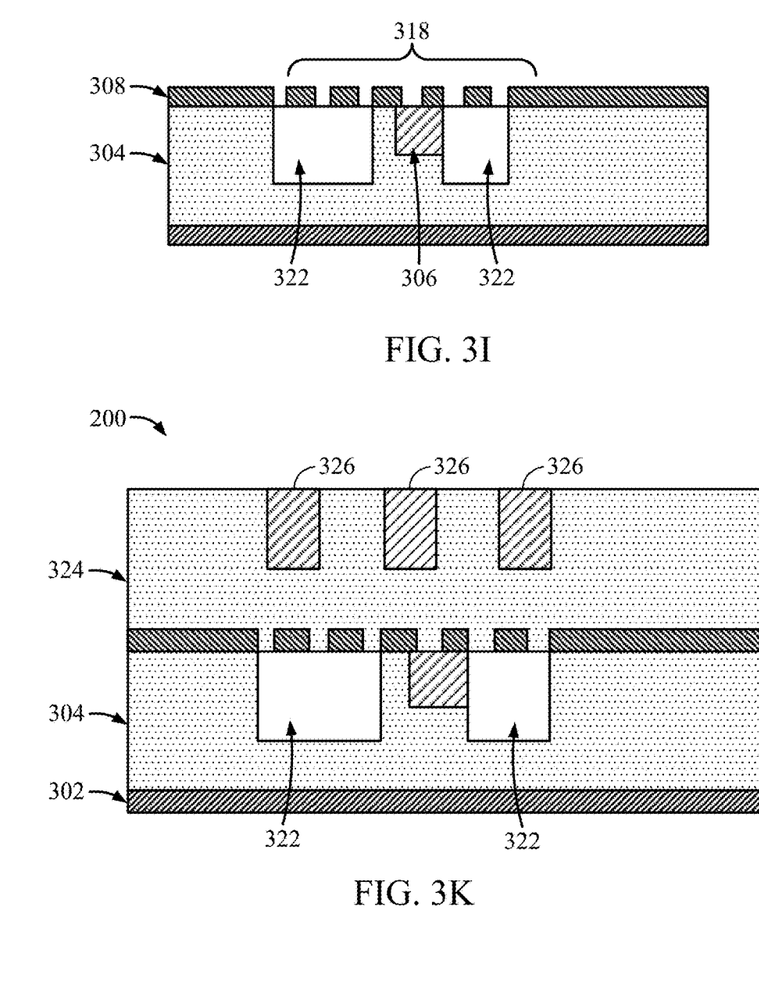

Thereafter, as illustrated in FIG. 3I, a fluorine (F)-based plasma isotropic etch may be applied to the dielectric layer 304 underneath the etch stop layer 308 to remove dielectric material under the etch stop layer 308 according to the nanostructure-gap pattern 318, forming the air gap 322. The dummy metal structure 306 may have a higher resistance to the plasma isotropic etch than the dielectric material in the dielectric layer 304. Thus, the dummy metal structure 306 may remain after the plasma isotropic etch is completed, providing some support for the structure and assisting with subsequent non-conformal deposition (described below) by reducing the expanse of the air gap to be covered. According to aspects, damage caused to the dummy metal structure 306 is not a concern since it is a dummy structure and is not used electrically (i.e., the dummy metal structure 306 is part of the functional circuitry of the semiconductor device 200). In some cases, the air gap 322 has a greater height than the dummy metal structure 306, as illustrated. However, in other cases, the air gap 322 may have a same height or a smaller height than the dummy metal structure 306.

Figure 3J:
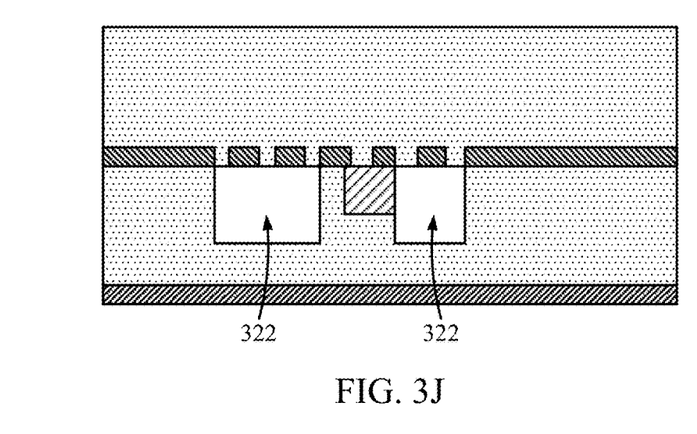

Thereafter, as illustrated in FIG. 3J, non-conformal chemical vapor deposition (CVD) may be performed to deposit a layer of dielectric material (e.g., low-κ material) on top of the etch stop layer 308, sealing the air gap 322 and forming the passive device layer 324. The non-conformal CVD closes the air gap 322 without filling in the air gap, unlike a conformal deposition process.

Thereafter, as illustrated in FIG. 3K, a plurality of passive device components 326 may be formed in the passive device layer 324. At least some of the passive device components 326 are formed over the air gap 322. In some cases, the plurality of passive device components 326 may correspond to one or more passive devices, such as a capacitor (e.g., MOM capacitor) and/or inductor. According to aspects and as noted above, the air gap 322 may reduce the parasitic shunt capacitance experienced by the plurality of passive device components 326. For example, since the dielectric constant of the air gap (e.g., ~1.0) is lower than the dielectric constant of the material of the dielectric layer 304 (e.g., ~2.8), the parasitic shunt capacitance between the plurality of passive device components 326 and the substrate layer 302 may be reduced.

Figure 4:
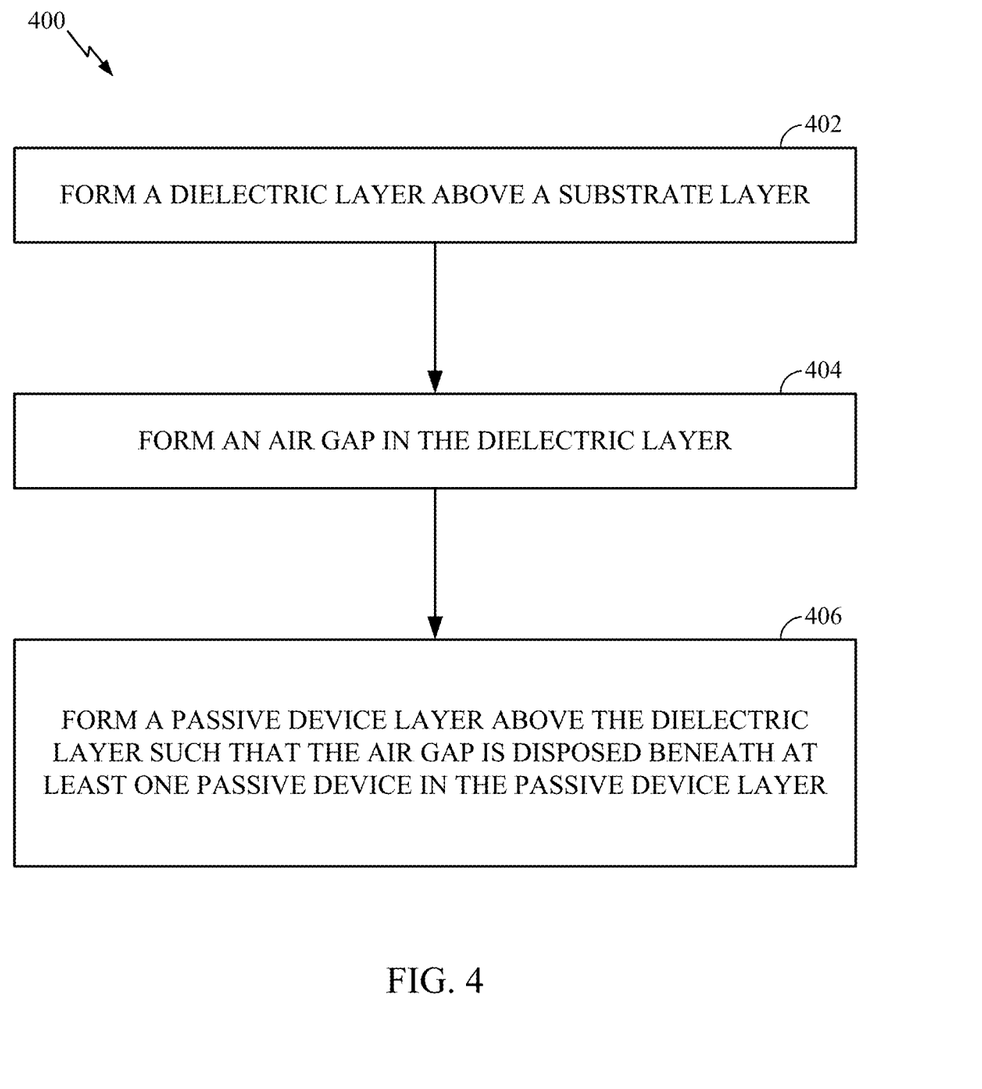
FIG. 4 is a flow diagram illustrating example operations for fabricating a semiconductor device including an air gap underneath passive devices, in accordance with certain aspects of the present disclosure.

FIG. 4 is a flow diagram illustrating example operations 400 for fabricating a semiconductor device including an air gap underneath passive devices, in accordance with certain aspects of the present disclosure. The operations 400 may be performed, for example, by a semiconductor processing facility.

The operations 400 begin, at block 402, with the semiconductor processing facility forming a dielectric layer (e.g., dielectric layer 304) above a substrate layer (e.g., substrate layer 302). In some cases, the dielectric layer comprises a carbon-doped oxide dielectric material.

At block 404, the semiconductor processing facility forms an air gap (e.g., air gap 322) in the dielectric layer.

At block 406, the semiconductor processing facility forms a passive device layer (e.g., passive device layer 324) above the dielectric layer such that the air gap is disposed beneath at least one passive device (e.g., passive device components 326) in the passive device layer. In some cases, the at least one passive device comprises at least one of a capacitor or an inductor.

In some cases, the dielectric layer comprises a plurality of sublayers, and the air gap extends through a subset of the plurality of sublayers.

In some cases, operations 400 may further include forming a dummy metal structure (e.g., dummy metal structure 306) in the dielectric layer. In some cases, the dummy metal structure may be disposed as a pillar with lateral surfaces (e.g., lateral surfaces 218) surrounded by the air gap. Further, in some cases, the air gap has a greater height than the dummy metal structure. In other cases, the air gap has a same height as the dummy metal structure. In yet other cases, the air gap has a smaller height than the dummy metal structure. In some cases, the dummy metal structure comprises primarily copper, cobalt, tungsten, ruthenium, or a combination thereof. In some cases, boundaries of the air gap line up vertically with outermost edges of the at least one passive device beneath which the air gap is disposed.

In some cases, forming the air gap in the dielectric layer may include forming an etch stop layer (e.g., etch stop layer 308) above the dielectric layer, forming a plurality of hard mask layers (e.g., silicon anti-reflective coating layer 314, low temperature oxide layer 312, and/or near-frictionless carbon layer 310) above the etch stop layer, and forming a copolymer layer (e.g., diblock copolymer layer 316) above the plurality of hard mask layers, wherein the copolymer layer comprises a plurality of nanostructures forming a nanostructure-gap pattern (e.g., pattern 318). In some cases, forming the air gap in the dielectric layer may further comprise transferring the nanostructure-gap pattern into the etch stop layer by etching the plurality of hard mask layers and the etch stop layer according to the nanostructure-gap pattern. Forming the air gap in the dielectric layer may further comprise using the nanostructure-gap pattern in the etch stop layer to etch the air gap into the dielectric layer and sealing the air gap by forming the passive device layer above (e.g., on top of) the etch stop layer.

According to certain aspects, the operations 400 further entail forming another air gap in the dielectric layer. In this case, the passive device layer may be formed at block 406 such that the other air gap is disposed beneath one or more other passive devices in the passive device layer.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one"

unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A semiconductor device comprising:
a substrate layer;
a passive device layer comprising at least one passive device;
a dielectric layer disposed between the substrate layer and the passive device layer; and
an etch stop layer disposed between the dielectric layer and the passive device layer, wherein:
the dielectric layer includes an air gap disposed beneath the at least one passive device in the passive device layer;
the dielectric layer includes at least one dummy metal structure disposed as a pillar with lateral surfaces surrounded by the air gap;
the air gap has a greater height than the dummy metal structure;
the etch stop layer includes a nanostructure-gap pattern with a plurality of gaps disposed above the air gap; and
the passive device layer is disposed above the etch stop layer and seals the air gap.

2. The semiconductor device of claim 1, wherein:
the dielectric layer comprises a plurality of sublayers; and
the air gap extends through a subset of the plurality of sublayers.

3. The semiconductor device of claim 1, wherein the dummy metal structure primarily comprises one of copper, cobalt, tungsten, ruthenium, or a combination thereof.

4. The semiconductor device of claim 1, wherein boundaries of the air gap line up vertically with outermost edges of the at least one passive device beneath which the air gap is disposed.

5. The semiconductor device of claim 1, wherein the dielectric layer comprises a carbon-doped oxide dielectric material.

6. The semiconductor device of claim 1, wherein the at least one passive device comprises at least one of a capacitor or an inductor.

7. A method for fabricating a semiconductor device, comprising:
forming a dielectric layer above a substrate layer;
forming an etch stop layer above the dielectric layer; and
forming a passive device layer, comprising at least one passive device, above the etch stop layer such that an air gap in the dielectric layer is disposed beneath the at least one passive device in the passive device layer, wherein:
the dielectric layer includes at least one dummy metal structure disposed as a pillar with lateral surfaces surrounded by the air gap;
the air gap has a greater height than the dummy metal structure;
the etch stop layer includes a nanostructure-gap pattern with a plurality of gaps disposed above the air gap in the semiconductor device; and
the passive device layer is disposed above the etch stop layer and seals the air gap.

8. The method of claim 7, wherein:
the dielectric layer comprises a plurality of sublayers; and
the air gap extends through a subset of the plurality of sublayers.

9. The method of claim 7, wherein the at least one dummy metal structure comprises primarily one of copper, cobalt, tungsten, ruthenium, or a combination thereof.

10. The method of claim 7, wherein the dielectric layer comprises a carbon-doped oxide dielectric material.

11. The method of claim 7, wherein the at least one passive device comprises at least one of a capacitor or an inductor.

12. The method of claim 7, further comprising forming the air gap in the dielectric layer comprises including:
forming a plurality of hard mask layers above the etch stop layer; and
forming a copolymer layer above the plurality of hard mask layers, wherein the copolymer layer comprises a plurality of nanostructures forming the nanostructure-gap pattern.

13. The method of claim 12, wherein forming the air gap in the dielectric layer further comprises transferring the nanostructure-gap pattern into the etch stop layer by etching the plurality of hard mask layers and the etch stop layer according to the nanostructure-gap pattern.

14. The method of claim 13, wherein forming the air gap in the dielectric layer further comprises:
using the nanostructure-gap pattern in the etch stop layer to etch the air gap into the dielectric layer; and
sealing the air gap by forming the passive device layer above the etch stop layer.

15. A semiconductor device comprising:
a substrate layer;
a passive device layer comprising at least one passive device;
a dielectric layer disposed between the substrate layer and the passive device layer; and
an etch stop layer disposed between the dielectric layer and the passive device layer, wherein:
the dielectric layer includes an air gap disposed beneath the at least one passive device in the passive device layer;
boundaries of the air gap line up vertically with outermost edges of the at least one passive device beneath which the air gap is disposed;
the etch stop layer includes a nanostructure-gap pattern with a plurality of gaps disposed above the air gap; and
the passive device layer is disposed above the etch stop layer and seals the air gap.

16. The semiconductor device of claim 1, wherein the nanostructure-gap pattern is based on a diblock copolymer.

* * * * *